United States Patent
Baek

(10) Patent No.: US 9,711,724 B2
(45) Date of Patent: Jul. 18, 2017

(54) MASK AND MASK ASSEMBLY

(71) Applicant: Samsung Display Co., Ltd., Yongin, Gyeonggi-Do (KR)

(72) Inventor: Dae Won Baek, Cheonan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 180 days.

(21) Appl. No.: 14/305,238

(22) Filed: Jun. 16, 2014

(65) Prior Publication Data

US 2015/0165464 A1 Jun. 18, 2015

(30) Foreign Application Priority Data

Dec. 18, 2013 (KR) .................. 10-2013-0158199

(51) Int. Cl.
| | |
|---|---|
| B05B 15/04 | (2006.01) |
| H01L 51/00 | (2006.01) |
| B05C 21/00 | (2006.01) |
| C23C 14/04 | (2006.01) |

(52) U.S. Cl.
CPC ........ *H01L 51/0011* (2013.01); *B05C 21/005* (2013.01); *C23C 14/042* (2013.01)

(58) Field of Classification Search
None
See application file for complete search history.

(56) References Cited

U.S. PATENT DOCUMENTS

| | | | |
|---|---|---|---|
| 2011/0229633 A1* | 9/2011 | Hong | .................. H01L 51/0011 427/162 |
| 2012/0266813 A1* | 10/2012 | Hong | .................... C23C 14/044 118/505 |

FOREIGN PATENT DOCUMENTS

| | | |
|---|---|---|
| JP | 2003-332057 | 11/2003 |
| KR | 1020050083422 A | 8/2005 |
| KR | 1020120065230 A | 6/2012 |
| KR | 10-1182239 B1 | 9/2012 |

* cited by examiner

*Primary Examiner* — Dah-Wei D Yuan
*Assistant Examiner* — Jethro M Pence
(74) *Attorney, Agent, or Firm* — Robert E. Bushnell, Esq.

(57) ABSTRACT

A mask has both ends supported on a frame while tensile force is applied in a first direction. The mask includes: a mask main body having a band shape which is extended in the first direction; a plurality of active patterns spaced apart in the first direction from each other in the mask main body and having a first shape; a plurality of first ribs surrounding borders of the plurality of respective active patterns and defining a shape of the active pattern; and a plurality of first dummy patterns surrounding the plurality of first ribs, respectively, and having a second shape.

15 Claims, 7 Drawing Sheets

MASK AND MASK ASSEMBLY

CLAIM OF PRIORITY

This application claims priority to and the benefit of Korean Patent Application No. 10-2013-0158199 filed in the Korean Intellectual Property Office on Dec. 18, 2013, the entire contents of which are incorporated herein by reference.

BACKGROUND OF THE INVENTION

Field of the Invention

The present invention relates to a mask and a mask assembly, and more particularly, to a mask and a mask assembly used to deposit an organic layer.

Description of the Related Art

In general, representative examples of a flat panel display include an organic light emitting display, a liquid crystal display, and a plasma display panel.

Among them, an electrode and an organic light emitting layer having specific patterns need to be formed in order to manufacture the organic light emitting display, and a deposition method using a mask assembly may be adopted as a method for forming the electrode and the organic light emitting layer.

More particularly, the organic light emitting display has a configuration in which pixels, which are basic units of image representation, are arrayed on a substrate in a matrix pattern, and an organic light emitting element, in which a positive first electrode and a negative second electrode are sequentially laminated with respective organic light emitting layers that emit beams of red, green, blue, white, and the like in respective pixels, is disposed. Herein, an organic material configuring the organic light emitting layer is very weak with respect to moisture and oxygen, and as a result, the organic light emitting layer needs to be completely isolated from moisture during a process of forming the organic light emitting layer and even after forming the organic light emitting layer. Therefore, it is difficult to perform patterning by using a general photolithography process. Accordingly, the organic light emitting layer, or the like, is primarily formed only in a part corresponding to each pattern by using a mask with an active pattern, through which a deposition material penetrates.

In recent years, a mask assembly is used, which includes a frame having an opening, and a plurality of masks having a band shape in which opposite ends are fixed to the frame so as to correspond to the opening.

Since tensile force is applied to the mask assembly of the related art, which is supported on the frame, a form of the active pattern formed in the mask deteriorates as a result of the tensile force applied to the mask.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide a mask and a mask assembly in which deterioration of the form of an active pattern formed in the mask is suppressed by tensile force applied to the mask.

Furthermore, the present invention has been developed in an effort to provide a mask and a mask assembly in which handling easiness is improved even though the active pattern has various forms.

An exemplary embodiment of the present invention provides a mask, opposite ends of which are supported on a frame while tensile force is applied in a first direction, the mask comprising: a mask main body having a band shape which is extended in the first direction; a plurality of active patterns spaced apart in the first direction from each other in the mask main body and having a first shape; a plurality of first ribs surrounding borders of the plurality of respective active patterns and defining a shape of the active pattern; and a plurality of first dummy patterns surrounding the plurality of first ribs, respectively and having a second shape.

The second shape may be a quadrangular shape.

The first shape may be a circular shape.

The first shape may be a polygonal shape.

Each of the active pattern and the first dummy pattern may have a stripe or dot pattern form.

The first rib may have a larger thickness than the active pattern and the first dummy pattern.

The first rib may include one or more first grooves which are dented from the bottom thereof.

The first rib may include one or more second grooves which are dented from the top thereof.

The mask may further include: a second rib positioned between the first rib and the first dummy pattern; and a second dummy pattern positioned between the first rib and the second rib.

The second rib may have an extended shape of the first rib.

Each of the active pattern, the first dummy pattern, and the second dummy pattern may have the stripe or dot pattern form.

The active pattern, the first dummy pattern, and the second dummy pattern may have the same pattern form.

The active pattern may have a different pattern form from the first dummy pattern and the second dummy pattern.

Another exemplary embodiment of the present invention provides a mask assembly comprising: a frame including an opening; and one or more masks positioned on the opening.

The mask may be provided in plural, and the plurality of respective masks may be disposed on the opening in a second direction which crosses the first direction.

According to exemplary embodiments of the present invention, there are provided a mask and a mask assembly in which deterioration of the form of an active pattern formed in the mask is suppressed by tensile force applied to the mask.

Furthermore, there are provided a mask and a mask assembly in which handling easiness is improved even though the active pattern has various forms.

According to another embodiment of the present invention, there is provided a mask assembly. The mask assembly may include a mask frame including an opening, and a plurality of band-shaped masks supported by the mask frame and arrayed in a second direction. Each band-shaped mask may extend across the opening of the mask frame along a first direction which is intersected by the second direction. Each band-shaped mask may include a plurality of pattern regions separated by walls. Each pattern region may include a first pattern, a second pattern, and at least one rib which has a closed loop shape interposed between the first pattern and the second pattern. Each of the first and second patterns may include a plurality of bars and a plurality of holes separated by the bars. A thickness of the rib may be greater than a thickness of any of the bars of the first and second patterns.

The pattern region may have a rectangular shape and the closed loop shape may be one of a circular shape or a polygonal shape.

A width of the rib may be greater than a width of any of the bars of the first and second patterns.

The thickness of the rib may be equal to a thickness of the walls.

Each band-shaped mask may bear a tensile force applied in the first direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
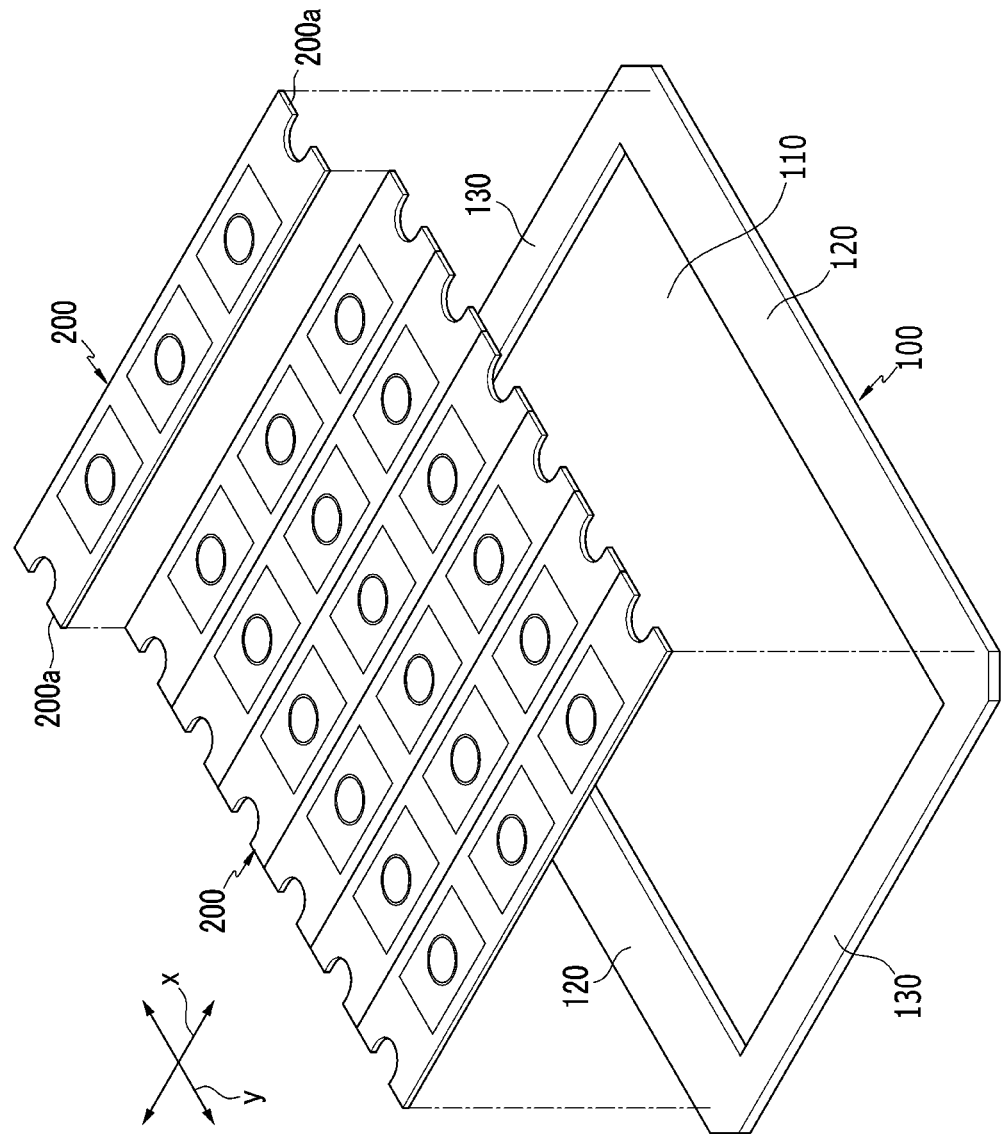
FIG. 1 is an exploded perspective view of a mask assembly according to an exemplary embodiment of the present invention.

Hereinafter, exemplary embodiments of the present invention will be described in detail with reference to the accompanying drawings so that those skilled in the technical field to which the present disclosure pertains may carry out the exemplary embodiments. The present invention may be implemented in various different forms, and is not limited to the exemplary embodiment described herein.

A part irrelevant to the description will be omitted so as to clearly describe the present invention, and the same or similar elements will be designated by the same reference numerals throughout the specification.

Furthermore, in exemplary embodiments, since like reference numerals designate like elements having the same configuration, a first exemplary embodiment is representatively described, and in other exemplary embodiments, only a configuration different from the first exemplary embodiment will be described.

In addition, each configuration illustrated in the drawings is arbitrarily shown for understanding and ease of description, but the present invention is not limited thereto.

In the drawings, the thickness of layers, films, panels, regions, etc. are exaggerated for clarity. In addition, in the drawings, for understanding and ease of description, the thicknesses of some layers and areas are exaggerated. It will be understood that, when an element such as a layer, film, region, or substrate is referred to as being "on" another element, it can be "directly on" the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, throughout the specification, "on" implies being positioned above or below a target element and does not imply being necessarily positioned on the top on the basis of a gravity direction.

Hereinafter, a mask assembly according to an exemplary embodiment of the present invention will be described with reference to FIGS. 1 to 4.

FIG. 1 is an exploded perspective view of a mask assembly according to an exemplary embodiment of the present invention.

As illustrated in FIG. 1, the mask assembly according to the exemplary embodiment of the present invention includes a frame 100 and a plurality of masks 200.

The frame 100 fixes and supports opposite ends 200a of each mask 200 and an opening 110 that exposes the mask 200. The frame 100 further includes a pair of first supports 120 facing each other in a first direction x with the opening 110 interposed therebetween, and a pair of second supports 130 facing each other in a second direction y which crosses the first direction x with the opening 110 interposed therebetween. Opposite ends 200a of the mask 200 are supported on the first supports 120. For example, opposite ends 200a of the mask 200 are supported on the first supports 120 of the frame 100 by using a fixing method such as welding, or the like, while tensile force is applied in the first direction x.

In the frame 100 of the mask assembly according to the exemplary embodiment of the present invention, the first support 120 constitutes a long side of the frame 100 having a quadrangular shape and the second support 130 constitutes a short side of the frame 100, but in the frame of the mask assembly according to another embodiment of the present invention, the first support 120 and the second support 130 have the same length. Alternatively, the second support 130 may constitute the long side and the first support 120 may constitute the short side.

Meanwhile, the frame of the mask assembly according to another embodiment of the present invention may have a polygonal or circular shape.

The mask 200 fixed to the frame 100 is supported on the frame 100 while the tensile force is applied in the first direction x, and since compression force is applied to the frame 100 in the first direction x which is an extension direction of the mask 200 by the tensile force in the first direction x, which is applied to the mask 200, the frame 100 may be made of a metallic material such as stainless steel having large rigidity so as to prevent or reduce deformation caused by the compression force of the mask 200.

The mask 200 has a band shape which is extended in the first direction x and opposite ends 200a are supported on the frame 100 while the tensile force is applied in the first direction x. The mask 200 is provided in plural, and each of the plurality of masks 200 is disposed in the frame 100 in the second direction y that crosses the first direction x so as to be supported on the frame 100.

Figure 2:
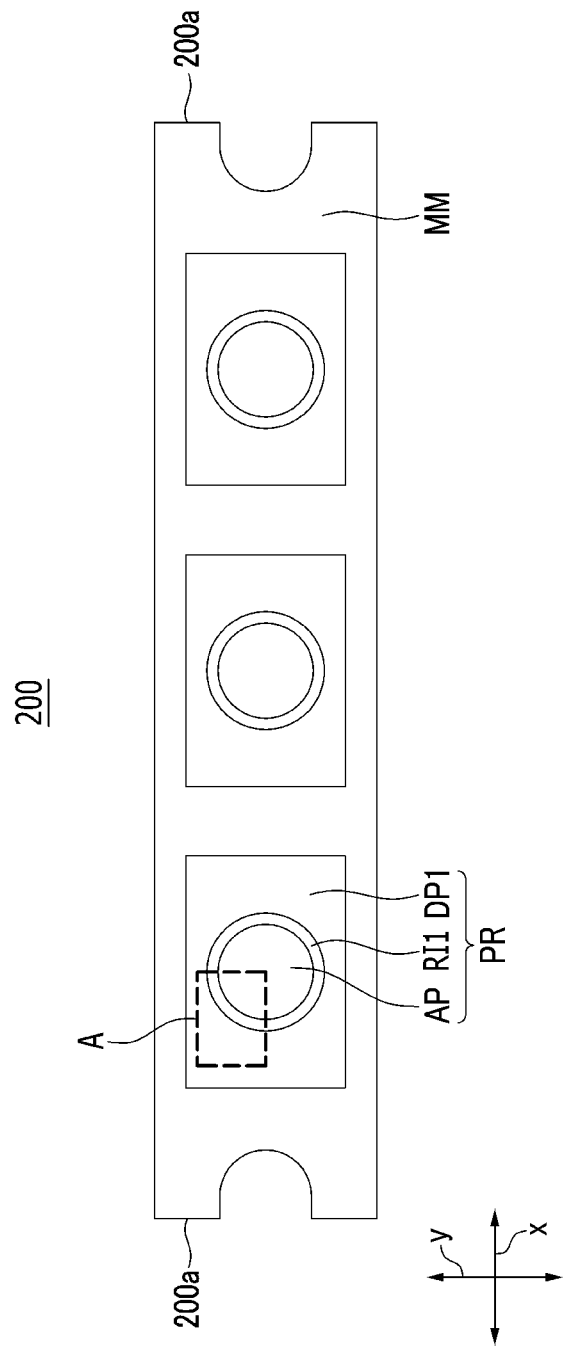
FIG. 2 is a planar view of a mask included in the mask assembly according to the exemplary embodiment of the present invention.
Figure 3:
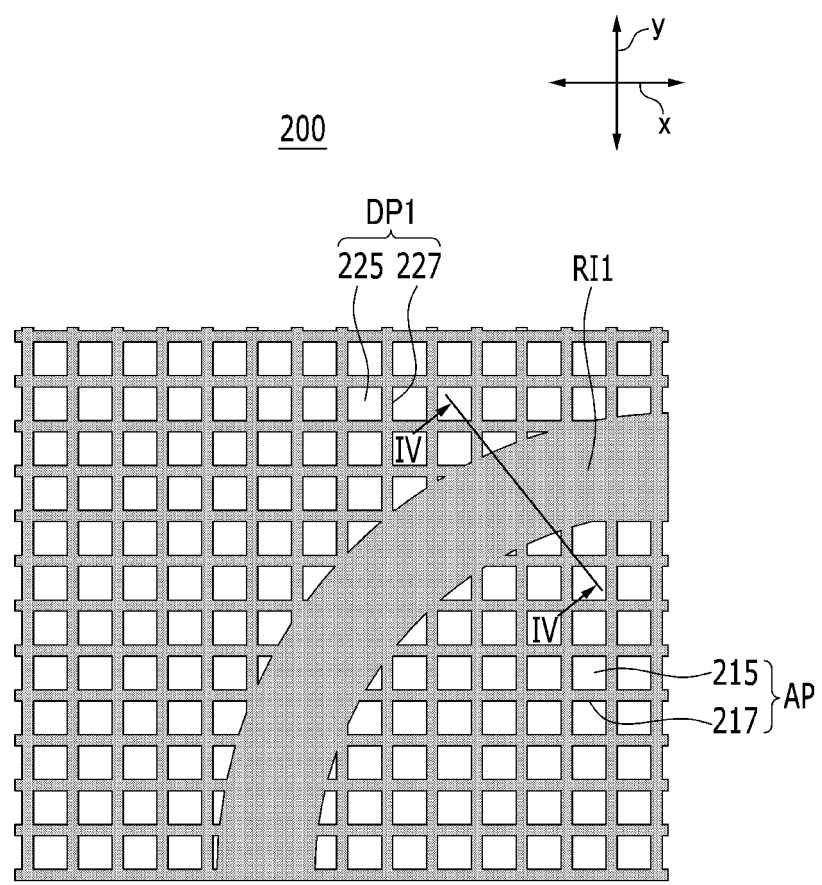
FIG. 3 is a planar view in which part A of FIG. 2 is enlarged.
Figure 4:
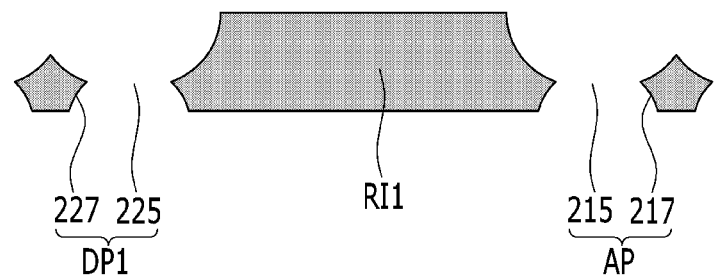
FIG. 4 is a cross-sectional view taken along line IV-IV of FIG. 3.

FIG. 2 is a planar view of a mask included in the mask assembly according to the exemplary embodiment of the present invention. FIG. 3 is a planar view in which part A of FIG. 2 is enlarged. FIG. 4 is a cross-sectional view taken along line IV-IV of FIG. 3.

As illustrated in FIGS. 2 to 4, the mask 200 includes a mask main body MM and a plurality of pattern regions PR. The pattern region PR may include an active pattern AP, a first rib RI1, and a first dummy pattern DP1.

The mask main body MM has a band shape which is extended in the first direction x and is positioned on the opening 110 of the frame 100 so as to be supported on the frame 100. A plurality of pattern regions PR, which are separated from each other by walls 210 in the first direction x, are formed in the mask main body MM.

The pattern region PR is provided in plural and the plurality of respective pattern regions PR are spaced apart from each other in one mask 200 in the first direction x. The active pattern AP formed in each pattern region PR may correspond to one organic light emitting display and in this case, organic light emitting patterns constituting a plurality of organic light emitting displays may be simultaneously formed by a single process on a mother board where the organic light emitting display is to be manufactured through the mask 200. That is, the active pattern AP formed in the first pattern region PR is disposed in the mask 200 so as to correspond to a deposition region of the organic light emitting patterns constituting the organic light emitting display. The active pattern AP formed in the pattern region PR has an open shape which penetrates the mask 200 so that the organic light emitting patterns constituting the organic light emitting display are formed on the mother board through the active pattern AP via a deposition process. The active pattern AP formed in the pattern region PR may have various pattern forms such as a stripe pattern or a dot pattern. For example, the active pattern AP formed in the pattern region PR has the dot pattern form or grid pattern form in the exemplary embodiment of the present invention.

Each of the plurality of active patterns AP has an overall circular first shape, and the organic light emitting display where the organic light emitting patterns are formed through the active pattern AP may have a circular display region.

Meanwhile, the active pattern AP according to the exemplary embodiment of the present invention has the circular first shape, but the present invention is not limited thereto, and the active pattern according to another embodiment of the present invention may have a polygonal shape such as a triangular shape, a quadrangular shape, a pentagonal shape, a hexagonal shape, a heptangular shape, an octagonal shape, an nanagonal shape, or the like, or a closed loop shape.

The first rib RI1 is provided in plural, and a plurality of first ribs RI1 surround borders of a plurality of active patterns AP, respectively. That is, each active pattern AP may be surrounded by a corresponding first rib RI1. The first rib RI1 defines a first shape of the active pattern AP. The first rib RI1 may have a circular band shape.

The active pattern AP may include a plurality of first holes 215 separated by a plurality of first bars 217. The first dummy pattern DP1 may include a plurality of second holes 225 separated by a plurality of second bars 227. The first rib RI1 has a thickness greater than the first bars 217 of the active pattern AP and the second bars 227 of the first dummy pattern DP1. Although not shown in the figures, a thickness of the first rib RI1 may be equal to a thickness of the wall 210. As a result, although the tensile force is applied to the mask main body MM in the first direction x, the shape of the first dummy pattern DP1 is first deformed by the tensile force, and as a result, the shape of the first rib RI1 is prevented from being deformed. That is, since the shape of the first rib RI1 is prevented from being deformed even though the tensile force is applied to the mask main body MM, the shape of the active pattern AP surrounded by the first rib RI1 is prevented from being deformed. According to another embodiment of the present invention, a width of the first rib RI1 is greater than a width of any of the first bars 217 and second bars 227.

The first dummy pattern DP1 is provided in plural and a plurality of first dummy patterns DP1 surround the plurality of first ribs RI1. That is, each first rib RI1 may be surrounded by a first dummy pattern DP1. The outer shape of the first dummy pattern DP1 has a second shape different from the first shape of the active pattern AP. The organic light emitting patterns are not formed through the first dummy pattern DP1 and the mask may be positioned on the first dummy pattern DP1 in the deposition process of the organic light emitting pattern. The first dummy pattern DP1 may have various pattern forms such as a stripe pattern or a dot pattern. For example, the first dummy pattern DP1 has the dot pattern form in the exemplary embodiment of the present invention.

The outer shape of the first dummy pattern DP1 has a quadrangular second shape. The outer shape of the first dummy pattern DP1 has the quadrangular second shape, and as a result, although the active pattern AP has the circular first shape, the mask 200 according to the exemplary embodiment of the present invention may be easily handled by using equipment that handles the mask in the related art.

In detail, most organic light emitting displays in the related art have a quadrangular shape in a plane, and as a result, the active pattern of the mask in the related art also has the quadrangular shape in a plane. Therefore, equipment that handles the mask in the related art is developed to correspond to the mask having the active pattern having the quadrangular shape.

In recent years, an organic light emitting display having the circular or polygonal shape in a plane has been developed according to a request from a user, and as a result, it is difficult to change equipment in order to handle a mask having a circular active pattern.

However, although the mask 200 according to the exemplary embodiment of the present invention includes the active pattern AP having the circular first shape, the outer shape of the first dummy pattern DP1, which surrounds the active pattern AP, has the quadrangular second shape corresponding to the active pattern in the related art, and as a result, the mask may be easily handled by using the equipment that handles the mask in the related art.

That is, although the first shape of the active pattern AP is the circular or polygonal shape in order to manufacture the organic light emitting display having the circular or polygonal shape, the outer shape of the first dummy pattern DP1 has the quadrangular second shape, and as a result, the mask 200 according to the exemplary embodiment of the present invention may be easily handled by using the equipment that handles the mask in the related art.

In other words, although the active pattern AP has various shapes, the mask 200, the ease of handling of which is improved, is provided.

As described above, the mask 200 of the mask assembly according to the exemplary embodiment of the present invention includes the active pattern AP, the first rib RI1, and the first dummy pattern DP1 that are formed in the pattern region PR, and as a result, when the tensile force is applied to the mask 200 in the first direction x, the first dummy pattern DP1 is first deformed by the tensile force, and as a result, the tensile force applied to the active pattern AP is distributed by the first dummy pattern DP1 so as to prevent the active pattern AP from being deformed by the tensile force applied in the first direction x.

Furthermore, in the mask 200 of the mask assembly according to the exemplary embodiment of the present invention, the first rib RI1 that surrounds the border of the active pattern AP has a thickness larger than those of the active pattern AP and the first dummy pattern DP1 defining the first shape of the active pattern AP, and the first rib RI1 thus has a higher rigidity than the first dummy pattern DP1. Alternatively, a width of the first rib RI1 is greater than a width of any of the first bars 217 which separate the first holes 215 of the active pattern AP and is greater than a width of any of the second bars 227 which separate the second holes 227 of the first dummy pattern DP1, and accordingly, the first rib RI1 thus has a high rigidity than the first dummy pattern DP1. As a result, when the tensile force is applied to the mask 200 in the first direction x, the shape of the first dummy pattern DP1 is first deformed by the tensile force and the tensile force is thus distributed, thereby preventing the shape of the first rib RI1 from being deformed. That is, since the shape of the first rib RI1 is prevented from being deformed even though the tensile force is applied to the mask main body MM, the shape of the active pattern AP surrounded by the first rib RI1 is prevented from being deformed by tensile force.

Furthermore, in the mask 200 of the mask assembly according to the exemplary embodiment of the present invention, although the first shape of the active pattern AP is a circular or polygonal shape in order to manufacture the organic light emitting display having the circular or polygonal shape, the first dummy pattern DP1 has the quadrangular second shape, and as a result, the mask 200 according to the exemplary embodiment of the present invention may be easily handled by using the equipment that handles the mask having the quadrangular active pattern in the related art. That is, although the active pattern AP has various shapes, the mask 200 having improved ease of handling is provided.

Hereinafter, a mask according to another embodiment of the present invention will be described with reference to FIG. 5.

Figure 5:
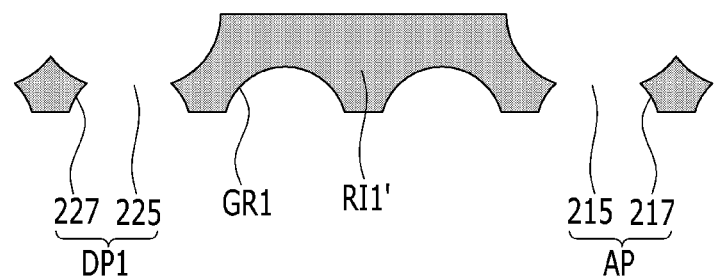
FIG. 5 is a cross-sectional view illustrating a part of a mask according to another embodiment of the present invention.

FIG. 5 is a cross-sectional view illustrating a part of a mask according to another embodiment of the present invention. The detailed descriptions of the same components are omitted below and only the different parts are mainly described.

As illustrated in FIG. 5, a first rib RI1' of a mask 200' according to another embodiment of the present invention includes a plurality of first grooves GR1 dented from the bottom of a first rib RI1'. The first groove GR1 is provided in plural in another embodiment of the present invention, but the present invention is not limited thereto, and the first groove may be one in yet another embodiment of the present invention.

As a result, when the tensile force is applied to the mask main body MM, the tensile force is distributed by the first groove GR1 so as to prevent the shape of the first rib RI1' from being deformed. That is, since the shape of the first rib RI1' is prevented from being deformed even though the tensile force is applied to the mask 200, the shape of the active pattern AP surrounded by the first rib RI1' is prevented from being deformed.

Hereinafter, a mask according to another embodiment of the present invention will be described with reference to FIG. 6.

Figure 6:
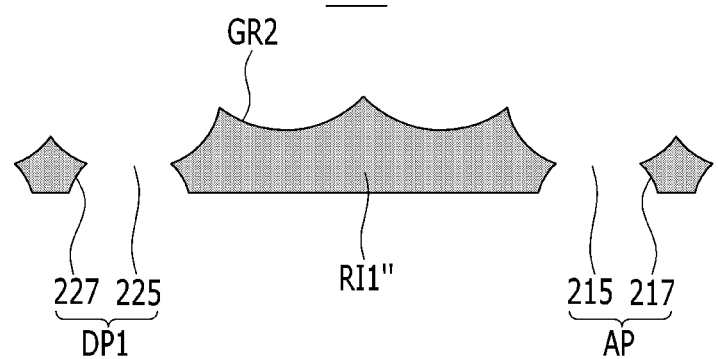
FIG. 6 is a cross-sectional view illustrating a part of a mask according to another embodiment of the present invention.

FIG. 6 is a cross-sectional view illustrating a part of a mask according to another embodiment of the present invention. Similarly, the detailed descriptions of the same components are omitted below and only the different parts are mainly described As illustrated in FIG. 6, a first rib RI1'' of a mask 200'' according to another embodiment of the present invention includes a plurality of second grooves GR2 dented from the top thereof. The second groove GR2 is provided in plural in another embodiment of the present invention, but the present invention is not limited thereto and the second groove may be one in yet another embodiment of the present invention.

As a result, when the tensile force is applied to the mask main body MM, the tensile force is distributed by the second groove GR2 so as to prevent the shape of the first rib RI1'' from being deformed. That is, since the shape of the first rib RI1'' is prevented from being deformed even though the tensile force is applied to the mask 200, the shape of the active pattern AP surrounded by the first rib RI1'' is prevented from being deformed.

Hereinafter, a mask according to another embodiment of the present invention will be described with reference to FIGS. 7 and 8.

Figure 7:
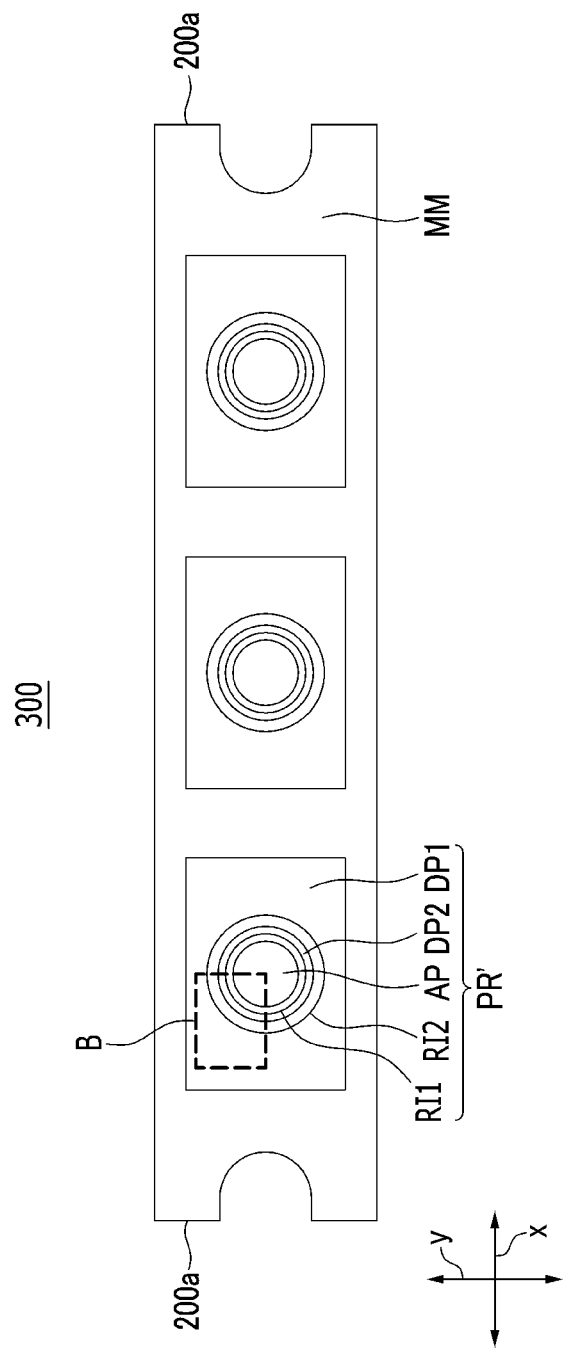
FIG. 7 is a planar view of a mask according to another embodiment of the present invention.

FIG. 7 is a planar view of a mask according to another embodiment of the present invention. FIG. 8 is a planar view in which part B of FIG. 7 is enlarged.

Figure 8:
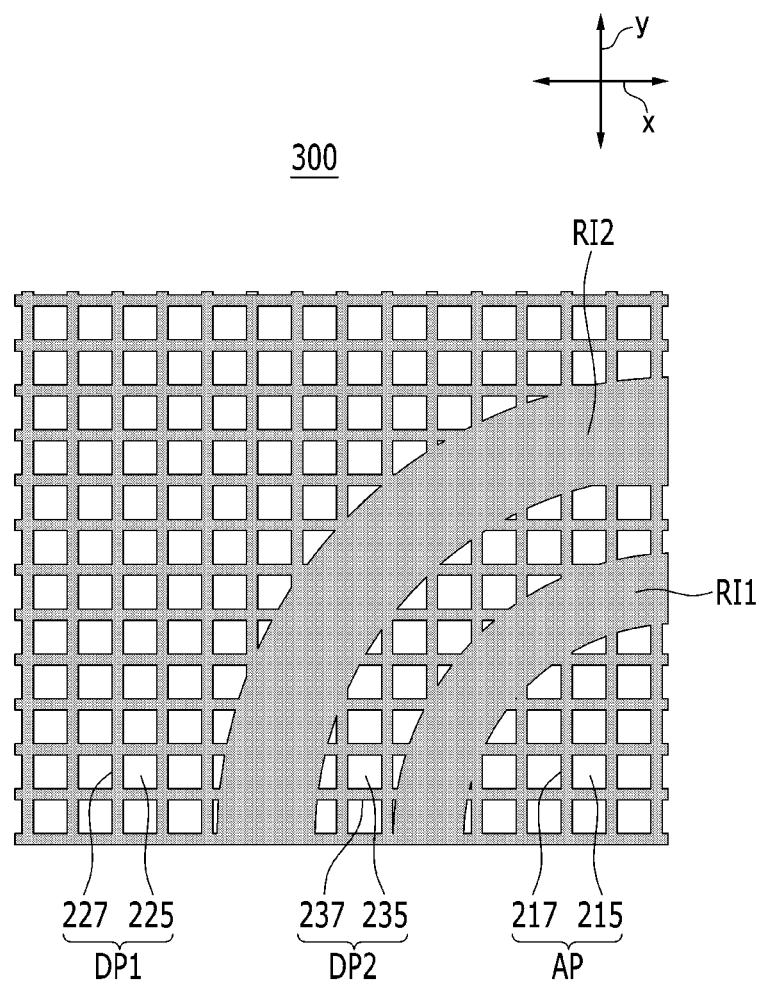
FIG. 8 is a planar view in which part B of FIG. 7 is enlarged.

As illustrated in FIGS. 7 and 8, a mask 300 according to another embodiment of the present invention includes a mask main body NM and a plurality of pattern regions PR'. Each pattern region PR' may include, an active pattern AP, a first rib RI1, a first dummy pattern DP1, a second rib RI2, and a second dummy pattern DP2. The detailed descriptions of the same components are omitted below and only the different parts are mainly described.

The second rib RI2 is provided in plural, and each of the plurality of second ribs RI2 is positioned between the first rib RI1 and the first dummy pattern DP1. The second rib RI2 has an extended shape of the first rib RI1 and has a circular band shape.

The second dummy pattern DP2 may include a plurality of third holes 235 separated by a plurality of third bars 237. The second rib RI2 has a thickness larger than the active pattern AP, the first dummy pattern DP1, and the second dummy pattern DP2. Alternatively, a width of the second rib RI2 is greater than a width of any of the first bars 217 of the active pattern AP, second bars 227 of the first dummy pattern DP1, and the third bars 237 of the second dummy pattern DP2. As a result, although the tensile force is applied to the mask main body MM in the first direction x, the shape of the first dummy pattern DP1 is first deformed by the tensile force, and as a result, the shape of the second rib RI2 is prevented from being deformed. That is, since the shape of the second rib RI2 is prevented from being deformed even though the tensile force is applied to the mask main body MM, the shape of the active pattern AP surrounded by the first rib RI1 is prevented from being deformed.

Meanwhile, the second rib RI2 may have a smaller thickness than the first rib RI1 in yet another embodiment of the present invention, and, as a result, the second rib RI2 is first deformed and the tensile force is thus distributed by the second rib RI2 to prevent the first rib RI1 from being deformed by the tensile force.

The second dummy pattern DP2 is provided in plural, and each of the plurality of second dummy patterns DP2 is positioned between the first rib RI1 and the second rib RI2. The organic light emitting patterns are not formed through the second dummy pattern DP2, and the mask may be positioned on the second dummy pattern DP2 in the deposition process of the organic light emitting pattern. The second dummy pattern DP2 may have various pattern forms such as a stripe pattern or a dot pattern. For example, the second dummy pattern DP2 has the dot pattern form in another embodiment of the present invention.

The second dummy pattern DP2 has the circular band shape between the first rib RI1 and the second rib RI2, but the present invention is not limited thereto, and the second dummy pattern DP2 may have various shapes, such as the polygonal shape or the closed loop shape, according to the shape of each of the first rib RI1 and the second rib RI2.

As described above, the mask 300 according to another embodiment of the present invention includes the active pattern AP, the first rib RI1, the first dummy pattern DP1, the second rib RI2, and the second dummy pattern DP2, and as a result, when the tensile force is applied to the mask 300 in the first direction x, the first dummy pattern DP1 is first deformed by the tensile force, and as a result, the tensile force applied to the active pattern AP is distributed by the first dummy pattern DP1 so as to prevent the active pattern AP from being deformed by the tensile force applied in the first direction x.

Furthermore, even though strong tensile force is applied to the mask 300 according to another embodiment of the present invention, the first dummy pattern DP1, the second rib RI2, and the second dummy pattern DP2 are first deformed in sequence and the tensile force is distributed in each of the first dummy pattern DP1, the second rib RI2, and the second dummy pattern DP2 so as to prevent the first rib RI1 and the active pattern AP from being deformed by the tensile force.

Hereinafter, a mask according to another embodiment of the present invention will be described with reference to FIG. 9.

Figure 9:
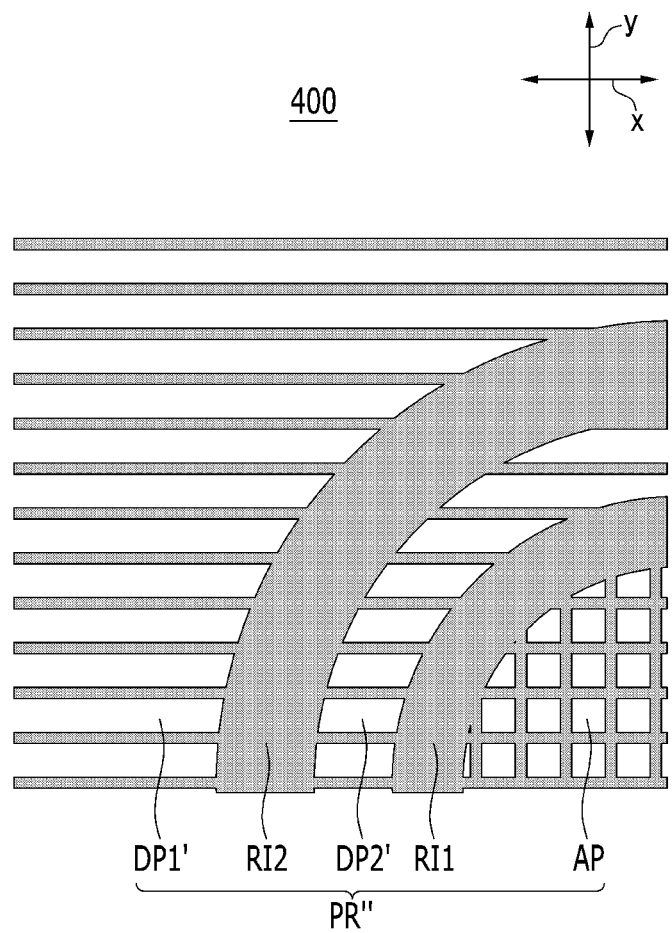
FIG. 9 is a planar view illustrating a part of a mask according to another embodiment of the present invention.

FIG. 9 is a planar view illustrating a part of a mask according to another embodiment of the present invention.

As illustrated in FIG. 9, a mask 400 according to another embodiment of the present invention includes a mask main body MM and a plurality of pattern regions PR". Each pattern region PR" may include an active pattern AP, a first rib RI1, a first dummy pattern DP1', a second rib RI2, and a second dummy pattern DP2'.

The second rib RI2 is provided in plural, and each of the plurality of second ribs RI2 is positioned between the first rib RI1 and the first dummy pattern DP1'. The second rib RI2 has an extended shape of the first rib RI1, and has the circular band shape.

The second rib RI2 has a thickness larger than the active pattern AP, the first dummy pattern DP1' and the second dummy pattern DP2'. As a result, although the tensile force is applied to the mask main body MM in the first direction x, the shape of the first dummy pattern DP1' is first deformed by the tensile force, and as a result, the shape of the second rib RI2 is prevented from being deformed. That is, since the shape of the second rib RI2 is prevented from being deformed even though the tensile force is applied to the mask main body MM, the shape of the active pattern AP surrounded by the first rib RI1 is prevented from being deformed.

Meanwhile, the second rib RI2 may have a smaller thickness than the first rib RI1 in yet another embodiment of the present invention, and as a result, the second rib RI2 is first deformed, and the tensile force is thus distributed by the second rib RI2 to prevent the first rib RI1 from being deformed by the tensile force.

The second dummy pattern DP2' is provided in plural, and each of the plurality of second dummy patterns DP2' is positioned between a first rib RI1 and a second rib RI2. The organic light emitting patterns are not formed through the second dummy pattern DP2', and the mask may be positioned on the second dummy pattern DP2' in the deposition process of the organic light emitting pattern.

The second dummy pattern DP2' has a circular band shape between the first rib RI1 and the second rib RI2, but the present invention is not limited thereto, and the second dummy pattern DP2' may have various shapes, such as the polygonal shape or the closed loop shape according to the shape of each of the first rib RI1 and the second rib RI2.

Each of the second dummy pattern DP2' and the first dummy pattern DP1' has the stripe pattern form formed in the x direction, and the active pattern AP has the dot pattern shape.

Meanwhile, the present invention is not limited thereto, and each of the second dummy pattern DP2', the first dummy pattern DP1', and the active pattern AP may have the stripe pattern or dot pattern form, and the second dummy pattern DP2', the first dummy pattern DP1', and the active pattern AP may have the same shape or the active pattern AP may have a different pattern form.

As described above, the mask 400 according to another embodiment of the present invention includes the active pattern AP, the first rib RI1, the first dummy pattern DP1', the second rib RI2, and the second dummy pattern DP2', and as a result, when the tensile force is applied to the mask 400 in the first direction x, the first dummy pattern DP1' is first deformed by the tensile force, and as a result, the tensile force applied to the active pattern AP is distributed by the first dummy pattern DP1' so as to prevent the active pattern AP from being deformed by the tensile force applied in the first direction x.

Furthermore, even though strong tensile force is applied to the mask 400 according to another embodiment of the present invention, the first dummy pattern DP1', the second rib RI2, and the second dummy pattern DP2' are first deformed in sequence, and the tensile force is distributed in each of the first dummy pattern DP1', the second rib RI2, and the second dummy pattern DP2'.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask having opposite ends supported on a frame while tensile force is applied in a first direction, said mask comprising:
    a mask main body having a band shape which is extended in the first direction;
    a plurality of active patterns spaced apart from each other in the first direction formed in the mask main body, each of the active patterns having a first shape, each active pattern including a plurality of holes;
    a plurality of first ribs, each of the first ribs enclosing a respective one of the plurality of active patterns, said each of the first ribs defining a shape of said respective one of the active patterns; and
    a plurality of first dummy patterns, each of the first dummy patterns completely enclosing a respective one of the plurality of first ribs, an outer shape of each first dummy pattern having a second shape, each first dummy pattern including a plurality of holes.

2. The mask of claim 1, wherein the second shape is a quadrangular shape.

3. The mask of claim 2, wherein the first shape is a circular shape.

4. The mask of claim 2, wherein the first shape is a polygonal shape.

5. The mask of claim 1, wherein said each of the active patterns and said each of the first dummy patterns has one of a stripe pattern form and a dot pattern form.

6. The mask of claim 1, wherein said each of the first ribs has a larger thickness than the active patterns and the first dummy patterns.

7. The mask of claim 6, wherein said each of the first ribs includes at least one groove which is dented from a bottom thereof.

8. The mask of claim 6, wherein said each of the first ribs includes at least one groove which is dented from a top thereof.

9. The mask of claim 1, further comprising a plurality of second ribs and a plurality of second dummy patterns, each second rib being positioned between a respective one of the first ribs and a respective one of the first dummy patterns, each second dummy pattern, which includes a plurality of holes, being positioned between a respective one of the first ribs and a respective one of the second ribs.

10. The mask of claim 9, wherein said each second rib has an extended shape of said respective one of the first ribs.

11. The mask of claim 10, wherein said each active pattern, said each first dummy pattern, and said each second dummy pattern has one of a stripe pattern form and a dot pattern form.

12. The mask of claim 9, wherein said each active pattern, said each first dummy pattern, and said each second dummy pattern has one of a stripe pattern form and a dot pattern form.

13. The mask of claim 9, wherein said each active pattern has a pattern which is different from a pattern of the first dummy pattern and a pattern of the second dummy pattern.

14. A mask assembly comprising at least one mask as recited in claim 1, said mask assembly further comprising a frame including an opening, said at least one mask being positioned in the opening.

15. The mask assembly of claim 14, wherein the mask is provided in plural; and wherein the plurality of masks are disposed in the opening in a second direction which crosses the first direction.

* * * * *